(12) United States Patent
Valenzuela

(10) Patent No.: US 6,935,411 B2
(45) Date of Patent: Aug. 30, 2005

(54) NORMAL-FLOW HEAT EXCHANGER

(75) Inventor: Javier A. Valenzuela, Grantham, NH (US)

(73) Assignee: Mikros Manufacturing, Inc., Claremont, NH (US)

(*) Notice: Subject to any disclaimer, the term of this patent is extended or adjusted under 35 U.S.C. 154(b) by 19 days.

(21) Appl. No.: 09/877,774

(22) Filed: Jun. 8, 2001

(65) Prior Publication Data

US 2001/0050162 A1 Dec. 13, 2001

Related U.S. Application Data

(60) Provisional application No. 60/120,213, filed on Jun. 8, 2000.

(51) Int. Cl.[7] .................................................. F28F 7/00

(52) U.S. Cl. ....................... 165/80.4; 165/168; 361/699

(58) Field of Search .............................. 165/80.3, 80.4, 165/164, 165, 166, 167, 168, 170, 173, 174, 175, 176, 185; 257/714; 361/699; 29/890.03

(56) References Cited

U.S. PATENT DOCUMENTS

| | | | | |
|---|---|---|---|---|
| 3,361,195 A | | 1/1968 | Meyerhoff et al. ............ 165/80 |
| 4,265,302 A | * | 5/1981 | Forster et al. ............... 165/165 |
| 4,450,472 A | | 5/1984 | Tuckerman et al. .......... 357/82 |
| 4,494,171 A | | 1/1985 | Bland et al. ................. 361/386 |
| 4,516,632 A | * | 5/1985 | Swift et al. .................. 165/167 |
| 4,880,055 A | | 11/1989 | Niggemann et al. ........ 165/167 |
| 5,005,640 A | * | 4/1991 | Lapinski et al. ............ 165/80.4 |
| 5,016,707 A | | 5/1991 | Nguyen ........................ 165/167 |
| 5,029,638 A | | 7/1991 | Valenzuela ................... 165/164 |
| 5,088,005 A | | 2/1992 | Ciaccio ........................ 361/385 |
| 5,099,311 A | * | 3/1992 | Bonde et al. ............... 165/80.4 |
| 5,145,001 A | | 9/1992 | Valenzuela ................... 165/164 |
| 5,269,372 A | * | 12/1993 | Chu et al. ................... 165/80.4 |
| 5,309,319 A | * | 5/1994 | Messina ...................... 165/80.4 |
| 5,429,183 A | | 7/1995 | Hisamori et al. ......... 165/134.1 |
| 5,727,618 A | | 3/1998 | Mundinger et al. ........ 165/80.4 |
| 5,835,345 A | | 11/1998 | Staskus et al. .............. 361/699 |
| 5,836,383 A | | 11/1998 | Zwittig ........................ 165/167 |
| 5,843,385 A | * | 12/1998 | Dugan ......................... 361/699 |
| 5,927,396 A | * | 7/1999 | Damsohn et al. ........... 165/167 |
| 6,005,772 A | | 12/1999 | Terao et al. ................. 361/699 |
| 6,167,952 B1 | | 1/2001 | Downing ..................... 165/167 |

OTHER PUBLICATIONS

L.S. Stephens, K.W. Kelly, D. Kountouris & J. McLean, "A Pin Fin Microheat Sink for Cooling Macroscale Conformal Surfaces Under the Influence of Thrust and Frictional Forces", Journal of Microelectromechanical Systems, vol. 10, No. 2, Jun. 2001, pp. 222–231.

Y. Murakami & B.B. Mikic, "Parametric Optimization of Multichanneled Heat Sinks for VLSI Chip Cooling", IEEE Transactions on Components and Packaging Technologies, vol. 24, No. 1, Mar. 2001, pp. 2–9.

L. Jiang, M. Wong & Y. Zohar, "Forced Convection Boiling in a Microchannel Heat Sink", Journal of Microelectromechanical Systems, vol. 10, No. 1, Mar. 2001, pp. 80–87.

(Continued)

*Primary Examiner*—Ljiljana Ciric
(74) *Attorney, Agent, or Firm*—Bowditch & Dewey, LLP

(57) ABSTRACT

A heat exchanger (120) comprising a core (130) containing inlet manifolds (140), outlet manifold (126) and interconnecting channels (144) and having a heat-transfer surface (128). Each interconnecting channel fluidly communicates at one end with a corresponding inlet manifold and at the other end with the two outlet manifolds located immediately adjacent that inlet manifold. The inlet manifolds are located distal from the heat-transfer surface. The interconnecting channels are configured such that substantially all of the heat collected by a working fluid is collected as the working fluid flows from the inlet manifolds toward the heat-transfer surface in a direction substantially perpendicular to the heat-transfer surface.

5 Claims, 8 Drawing Sheets

OTHER PUBLICATIONS

J. Darbi, M.M. Ohadi & D. DeVoe, "An Electrohydrodynamic Polarization Micropump for Electronic Cooling", Journal of Microelectromechanical Systems, vol. 10, No. 1, Mar. 2001, pp. 98–106.

C. Perret, J. Boussey, C. Schaeffer & M. Coyaud, "Analytic Modeling, Optimizing, and Realization of Cooling Devices in Silicon Technology", IEEE Transactions on Components and Packaging Technologies, vol. 23, No. 4, Dec. 2000, pp. 665–672.

D. Copeland, "Manifold Microchannel Heat Sinks: Analysis and Optimization", ASME/JSME Thermal Engineering Conference: vol. 4, 1995, pp. 169–174.

D. Copeland, H. Takahira, W. Nakayama & B. Pak, "Manifold Microchannel Heat Sinks: Theory and Experiment", Advances in Electronic Packing, EEP–vol. 10–2, 1995, pp. 829–835.

A. Weisberg, H.H. Bau & J.N. Zemel, "Analysis of microchannels for integrated cooling", Int. J. Heat Mass Transfer, 1992, vol. 35, No. 10, pp. 2465–2474.

D.B. Tuckerman & R.F.W. Pease, "High–Performance Heat Sinking for VLSI", IEEE Electron Device Letters, May 1981, vol. EDL–2, No. 5, pp. 126–129.

* cited by examiner

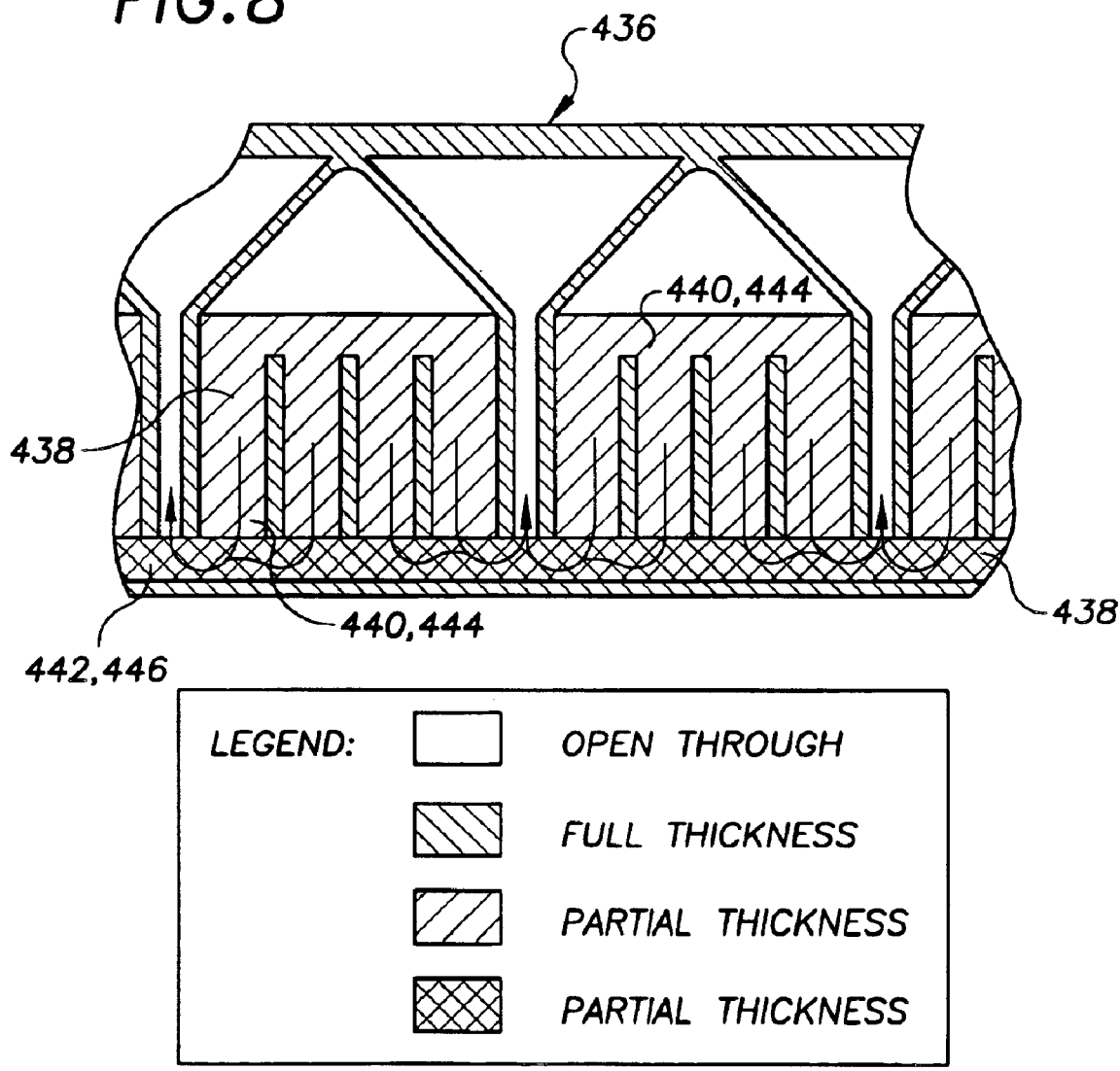

NORMAL-FLOW HEAT EXCHANGER

RELATED APPLICATION

This application claims priority on U.S. Provisional Patent Application Ser. No. 60/210,213, filed Jun. 8, 2000, entitled "Laminate Normal Flow Heat Exchanger for Improved Inlet/Outlet Headering".

FIELD OF THE INVENTION

The present invention relates generally to heat transfer devices. More particularly, the present invention is directed to a normal-flow heat exchanger.

BACKGROUND OF THE INVENTION

Heat exchangers that utilize a single-phase working fluid to transfer heat from a heat source or to a heat sink are known as single-phase heat exchangers. Single-phase heat exchangers are used in a variety of applications ranging from radiators of conventional automobiles to more exotic water-to-ammonia heat exchangers for sustaining life in outer space, e.g., aboard a space shuttle or a space station. Single-phase heat exchangers are also used in other diverse applications, such as removing waste heat from electronic devices, e.g., microprocessors, cooling fusion reactor diverters and producing slush hydrogen.

Compact single-phase heat exchangers are particularly desirable in applications having relatively high heat fluxes. For example, the continually increasing speeds and complexity of microprocessors cause these microprocessors to generate commensurately increasing amounts of heat. Present generation microprocessors typically have heat fluxes in the range of 5 watts/cm$^2$ to 15 watts/cm$^2$. The next several generations of microprocessors are predicted to have much greater heat fluxes, e.g., on the order of 50 watts/cm$^2$ to 200 watts/cm$^2$ or more. One type of compact heat exchanger contemplated for high flux heat transfer applications is what has become known as a normal-flow heat exchanger (NFHX). Specific embodiments of NFHXs have been previously disclosed by the present inventor, e.g., in U.S. Pat. Nos. 5,029,638 and 5,145,001. An NFHX is desirable for applications such as microprocessor cooling because it provides: (1) a single phase heat exchanger having a high surface heat flux capability; (2) a compact heat exchanger in which the working fluid experiences a generally small pressure drop as it passes through the heat exchanger; and (3) a small and lightweight heat exchanger having a high thermal transfer efficiency.

FIG. 1 shows one embodiment of an NFHX 20 as taught in the aforementioned patents. NFHX 20 includes a heat-transfer surface 22 for thermally communicating with a heat source or sink (not shown). For example, heat-transfer surface 22 may be thermally coupled to a microprocessor for removing waste heat from the microprocessor. NFHX 20 further includes a heat-transfer element 24 comprising an inlet end 26 located opposite heat-transfer surface 22 and a plurality of closely spaced plates 28. The spaces between plates 28 define a plurality of passageways 30 that are substantially normal to heat-transfer surface 22. A plurality of outlet manifolds 32 are located adjacent, and parallel, to heat-transfer surface 22. Outlet manifolds 32 are spaced from one another and each intersects each passageway 30 to permit a working fluid 34 to flow from the passageways into the outlet manifolds.

During use, working fluid 34 flows from a source (not shown) into passageways 30 via inlet end 26, and then through passageways 30 to outlet manifolds 32 in a direction substantially normal to heat-transfer surface 22, and out of heat-transfer element 24 through the outlet manifolds in a direction substantially parallel to the heat-transfer surface. As working fluid 34 flows through heat-transfer element 24, it gains, or loses, most of its heat while flowing through passageways 30. The heat is transferred to, or from, working fluid 34 via plates 28, which are in thermal communication with heat-transfer surface 22. It is the fact that the majority of heat transfer to or from working fluid 34 occurs in passageways 30 that are normal to heat-transfer surface 22 that NFHX 20 gets its name.

Unfortunately, conventional NFHXs have a number of shortcomings. For example, for NFHX 20 to provide highly efficient heat removal, the spacing between plates 28, and, hence the depth of normal-flow passageways 30, must be very small, preferably less than 0.10 mm. Relatedly, to increase the heat transfer efficiency of NFHX 20, it is desirable to make plates 28 relatively thin, e.g., on the order of 0.25 mm or less. Accordingly, the dimensions of plates 28, passageways 30 and outlet manifolds 32 must be precisely controlled. Typically, the elements of an NFHX are fabricated using techniques such as traveling-wire EDM and traditional machining. However, these techniques are typically not capable of, or are impractical for, forming elements having the small dimensions necessary for producing NFHXs capable of handling the high heat fluxes of the next generation of microprocessors.

In addition, the configuration of passageway 30 and outlet manifolds 32 produces performance limitations that limit conventional NFHX 20 from achieving the needed high flux heat transfer capacity. For example, the location of outlet manifolds 32 proximate to heat-transfer surface 22 interferes with the direct conduction of heat between the heat-transfer surface and plates 28. Outlet manifolds 32 extend the length of NFHX 20 and, therefore, interrupt thermal conduction from heat-transfer surface 22 to plates 28 along the entire length of the NFHX. This interruption increases the thermal resistance between heat-transfer surface 22 and working fluid 34 in passageways 30. For this reason, it is desired to make the outlet manifolds 32 as small as possible in cross-sectional dimension, but this has the detrimental effect of increasing the pressure drop therewithin. In addition, pressure drop within outlet manifolds 32 creates non-uniform flow distribution of working fluid 34 over the cooling area of plates 28, thereby reducing the heat transfer efficiency of NFHX 20.

The normal-flow heat exchanger of the present invention, however, overcomes these and other shortcomings of conventional normal-flow heat exchangers.

SUMMARY OF THE INVENTION

In one aspect, the present invention is directed to a heat exchanger that comprises a core having a length, a width perpendicular to the length and a heat transfer surface extending along the length and the width. A plurality of first manifolds are formed in the core and extend along the length, and a plurality of second manifolds are formed in the core and extend substantially co-extensively, and are located alternatingly across the width, with the plurality of first manifolds. A plurality of interconnecting channels are formed in the core and are spaced from one another along the length. Each of the plurality of interconnecting channels has a first end fluidly communicating with at least one of the plurality of first manifolds and a second end fluidly communicating with at least one of the plurality of second manifolds.

In another aspect, the present invention is directed to an assembly comprising a heat exchanger that includes a core having a length, a width perpendicular to the length and a heat transfer surface extending along the length and the width. A plurality of first manifolds are formed in the core and extend along the length and a plurality of second manifolds are formed in the core and extend substantially co-extensively, and are located alternatingly across the width, with the plurality of first manifolds. A plurality of interconnecting channels are formed in the core and are spaced from one another along the length. Each of the plurality of interconnecting channels have a first end fluidly communicating with at least one of the plurality of first manifolds and a second end fluidly communicating with at least one of the plurality of second manifolds. A device is in thermal communication with the heat-transfer surface.

BRIEF DESCRIPTION OF THE DRAWINGS

For the purpose of illustrating the invention, the drawings show a form of the invention that is presently preferred. However, it should be understood that the present invention is not limited to the precise arrangements and instrumentalities shown in the drawings, wherein:

FIG. 8 is an elevational view of another alternative embodiment of a heat-exchanger plate that may be used to form the core of the normal-flow heat exchanger of FIG. 2.

DETAILED DESCRIPTION OF THE DRAWINGS

Figure 1:
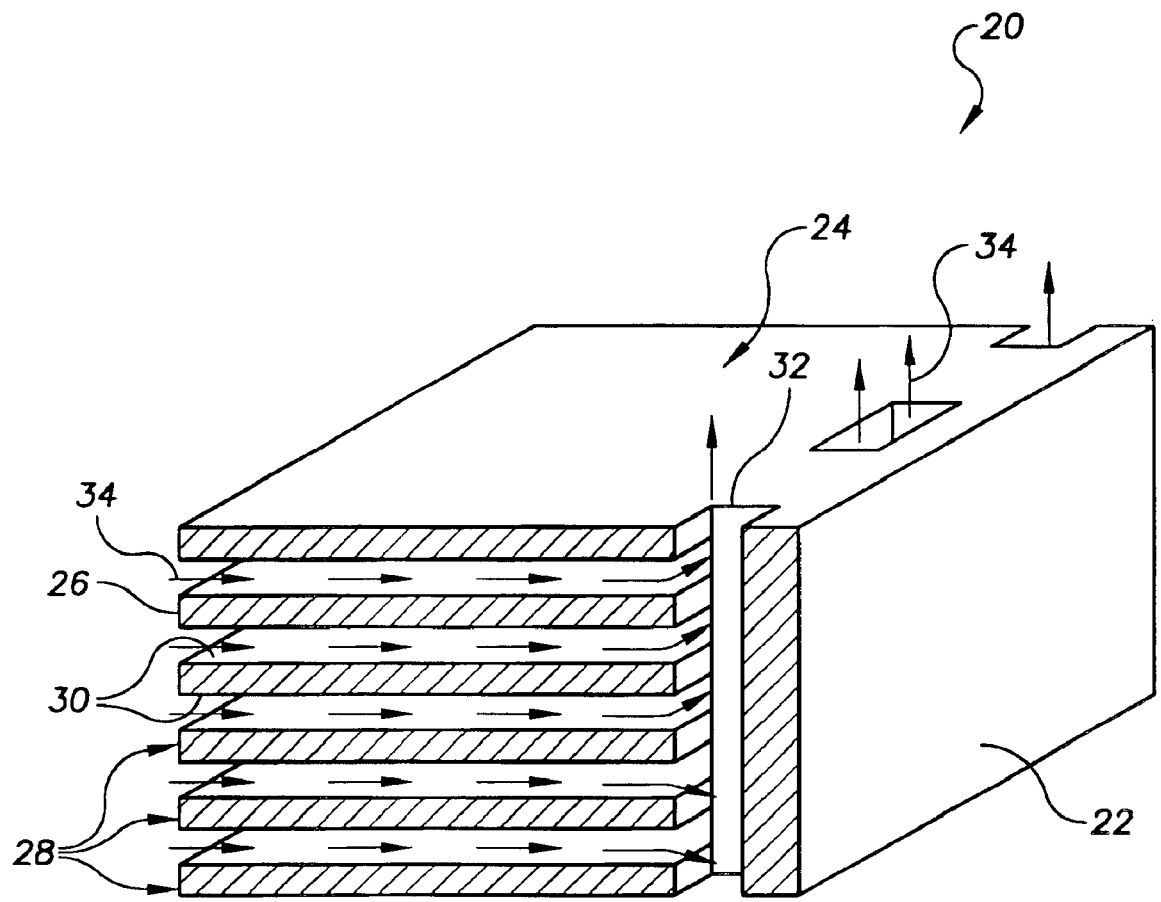
FIG. 1 is a perspective view of a prior art normal-flow heat exchanger.
Figure 2:
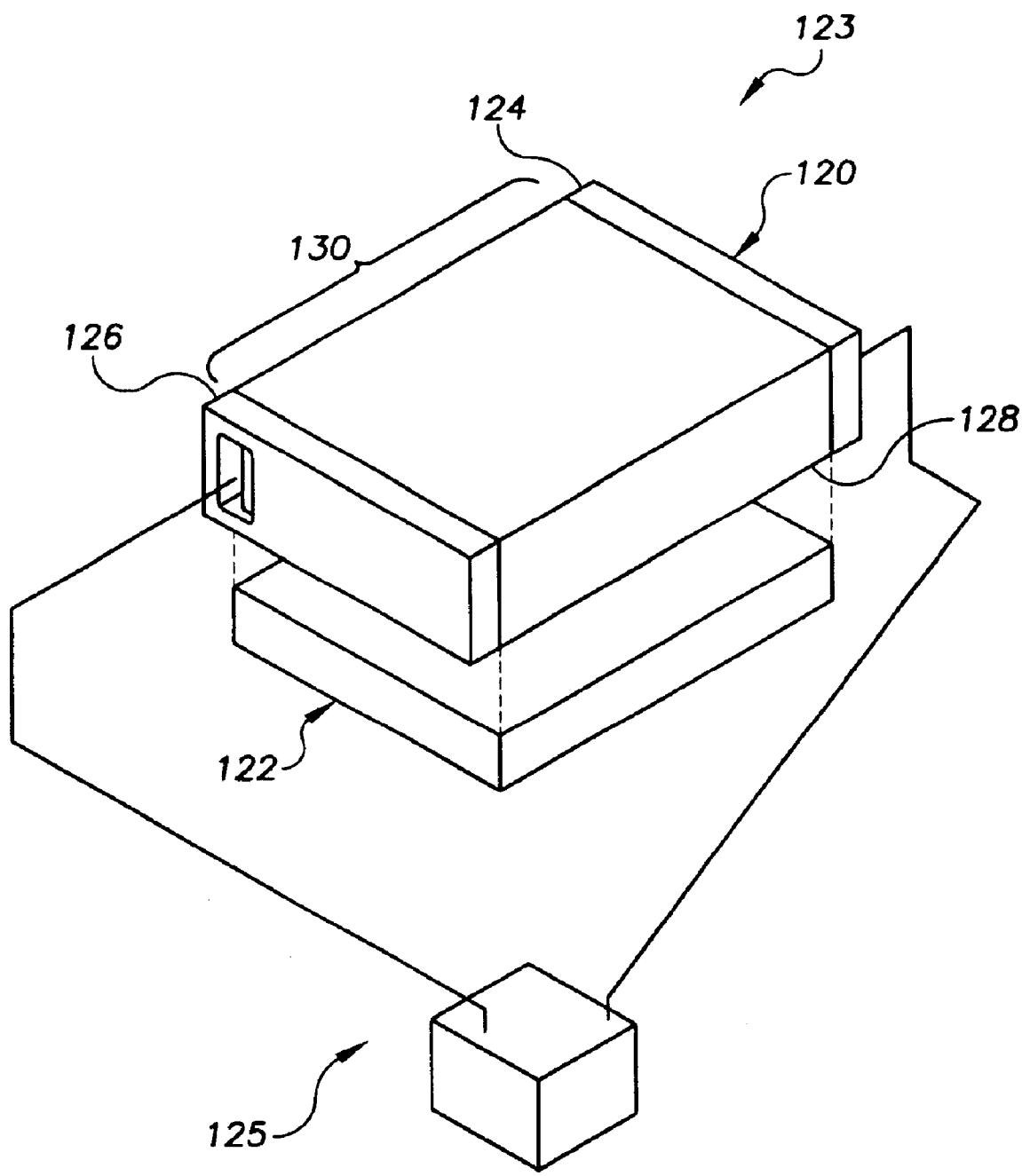
FIG. 2 is a perspective view of a normal-flow heat exchanger of the present invention, shown located adjacent a device from, or to, which heat may be transferred by the normal flow heat exchanger.

Referring now to the drawings, wherein like numerals indicate like elements, FIG. 2 shows in accordance with the present invention a normal-flow heat exchanger (NFHX), which is generally denoted by the numeral 120. NFHX 120 is adapted for utilizing a heat-transfer, or working, fluid, such as water, ammonia and refrigerants such as R-134, among others, to remove heat from, or provide heat to, a device 122 in thermal communication with the NFHX. In a preferred embodiment, device 122 is a microprocessor that generates excess heat. Examples of other devices with which NFHX 120 may be used for removing heat include other electronic devices, a diverter plate of a fusion reactor, or an apparatus for making slush hydrogen, among others. Alternatively, device 122 may require input of heat, such as a radiator panel for the living quarters of a space vehicle or space station, among others. One skilled in the art will recognize the diverse applications for NFHX 120 of the present invention, and that an exhaustive recitation of such applications need not be presented herein.

NFHX 120 is preferably part of a closed heat-transfer circuit 123 having a flow re-circulation system 125 for providing the working fluid to and conducting the working fluid away from, the NFHX. Accordingly, NFHX 120 includes an inlet plenum 124 for receiving the working fluid from re-circulation system 125 and an outlet plenum 126 for returning the working fluid to the re-circulation system. NFHX 120 also includes a heat-transfer surface 128 extending between inlet and outlet plena 124, 126 that may be adapted for thermally communicating with device 122 so that heat can flow between NFHX 120 and the device. For example, heat-transfer surface 128 may directly contact device 122 or may be in thermal communication therewith through an intermediate material (not shown), such as an adhesive, thermal grease, or a heat spreader, among others. As described below in detail, NFHX 120 contains internal passageways for directing the flow of the working fluid through the NFHX. The internal passageways may be configured to provide NFHX 120 with heat transfer capacity for heat fluxes at least as great as 250 watts/cm$^2$, while maintaining a compact overall size, which may be on the order of the size of a microprocessor chip. In some embodiments, NFHX 120 may be designed to handle heat fluxes of 1,000 watts/cm$^2$ or more. Generally, the heat-transfer capacity is limited primarily by the magnitude of the pressure drop within NFHX. In addition and as described below, NFHX 120 may be made from a plurality of precisely-formed plates stacked with one another to form the unitary structure of the NFHX. Such precise forming is particularly desirable for making NFHX 120 relatively very small while providing a relatively high heat flux capacity.

Figure 3:
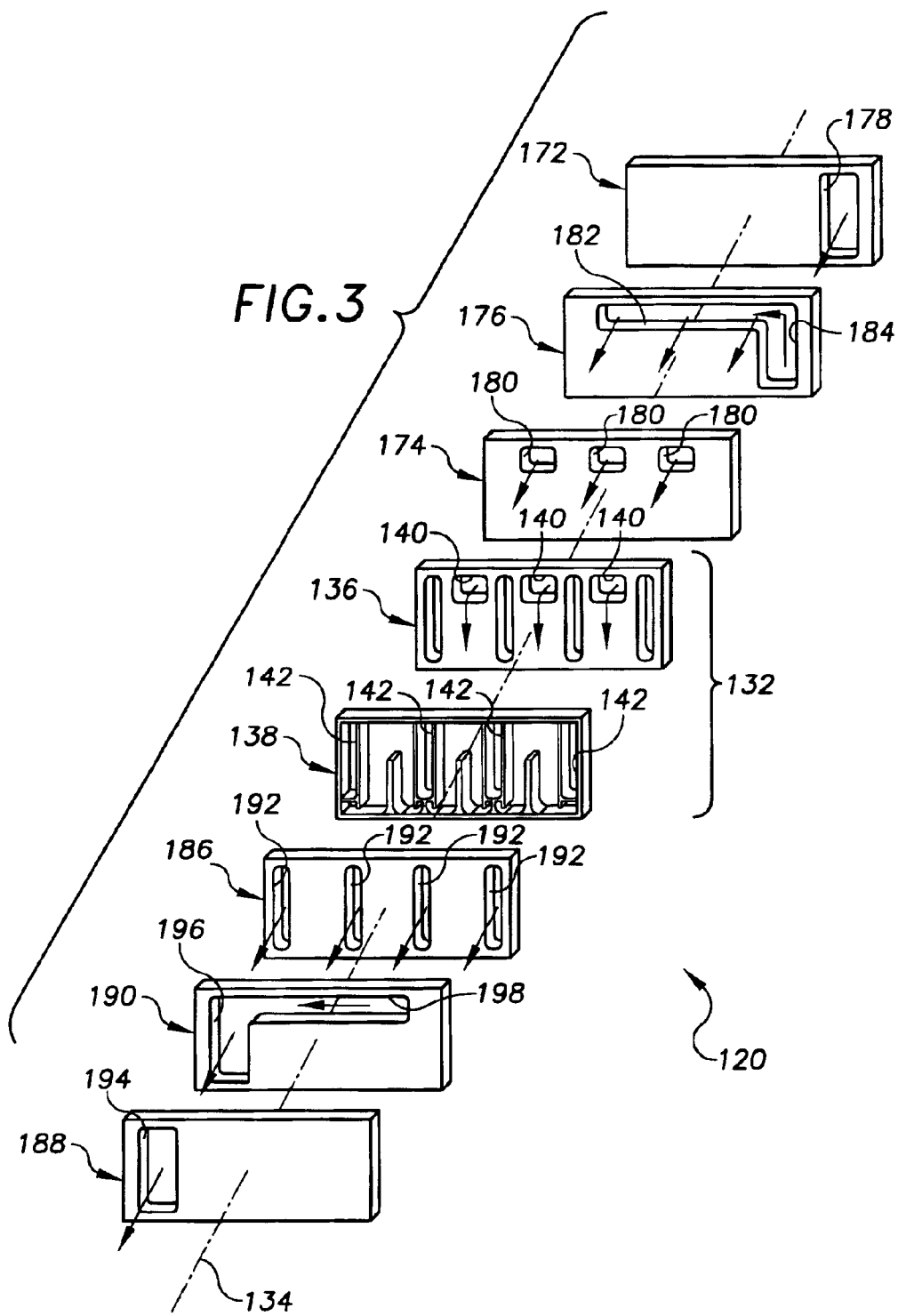
FIG. 3 is an exploded perspective view of a laminated embodiment of a normal-flow heat exchanger of the present invention.

Referring now to FIGS. 2–5, core 130 may comprise a plurality of plate pairs 132 stacked with one another along a stacking axis, such as stacking axis 134 extending through inlet and outlet plena 124, 126 of NFHX 120. Each plate pair generally comprises a heat-exchanger plate 136 and a spacer plate 138. Although FIG. 3 shows only one plate pair 132, it is to be understood that core 130 will typically contain many of such plate pairs, e.g., 50 pairs or more, stacked in registration with one another to form the various below-described passageways therein. When properly stacked, the plurality of plate pairs 132 may define three inlet manifolds 140 extending the length of core 130, four outlet manifolds 142 extending the length of the core and a plurality of interconnecting channels 144 fluidly communicating with at least one inlet manifold at one end and at least one outlet manifold at the opposite end. One skilled in the art will recognize that the particular number of inlet and outlet manifolds shown is merely illustrative. Any number of inlet and outlet manifolds may be provided. In addition, one skilled in the art will understand that the terms "inlet" and "outlet" as used herein, and in the claims appended hereto, are interchangeable with one another. For example, what is designated as an inlet manifold for flow in one direction will become an outlet manifold for flow in the opposite direction.

If the stacking axis is parallel to inlet and outlet manifolds 140, 142 as shown, the number of plate pairs 132 required will generally be a function of the desired operating characteristics of NFHX 120 that generally dictate the thicknesses of the heat-exchanger and spacer plates 136, 138. However, if the stacking axis is perpendicular to inlet and outlet manifolds 140, 142, the configurations of each stacked plate will be much different from plates 136, 138 shown in FIG. 3 and will have other criteria, such as the ability to form the passageways therein, limiting the number of such plates needed. Although NFHX 120 is shown as having plate pairs 132 each comprising a single heat-exchanger plate 136 and a single spacer plate 138, one skilled in the art will appreciate that each heat-exchanger plate and each spacer plate may be a composite of two or more like-shaped plates. This may be desirable when the thickness of the sheet materials from which plates are made is less than the desired thickness of the corresponding plate. One skilled in the art will also appreciate that a single plate may be used in lieu of plate pairs 132. Techniques for forming such a plate are described below in connection with plate 236 of FIG. 6.

Figure 4:
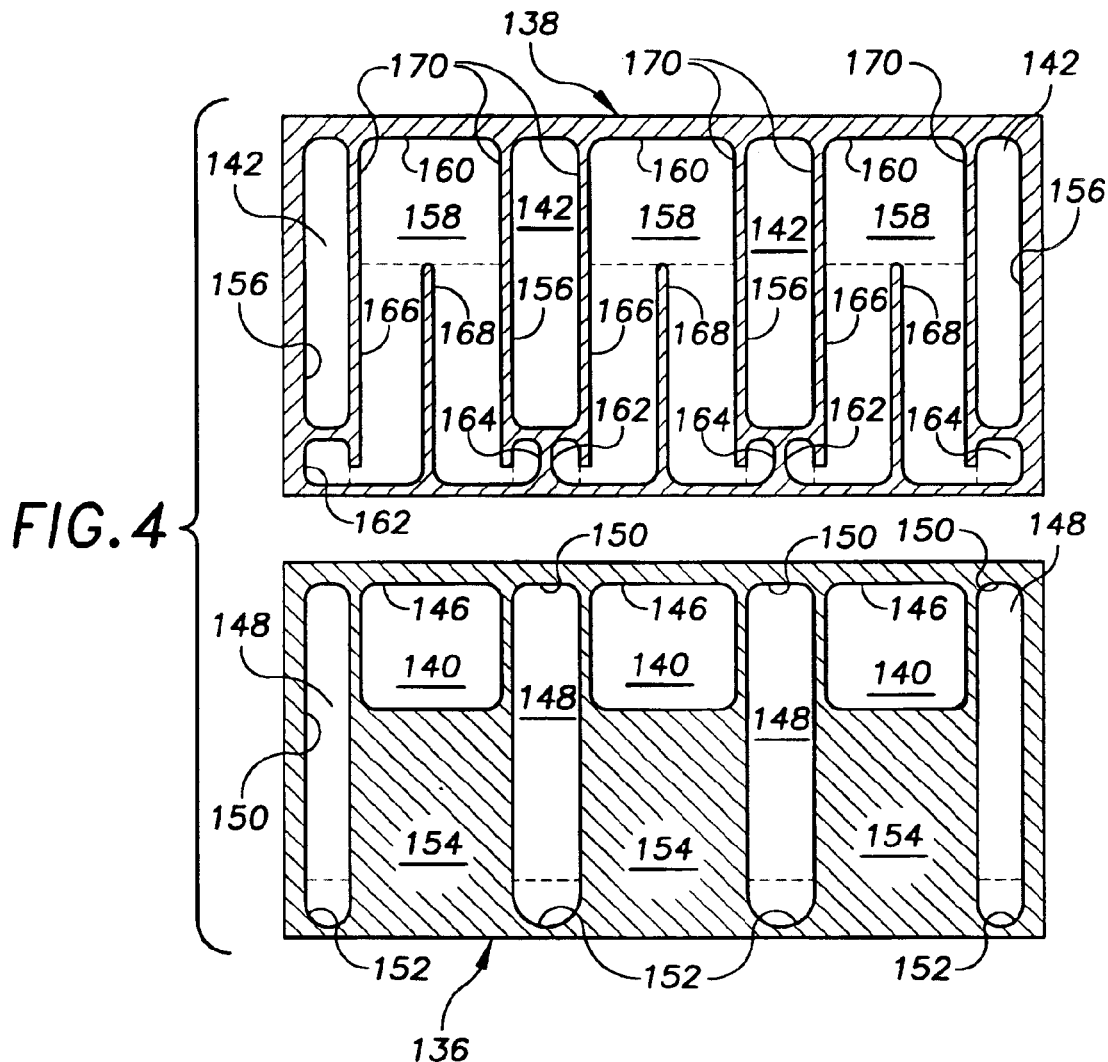
FIG. 4 is composed of an elevational view of a heat-exchanger plate and an elevational view of a corresponding spacer plate that may be used to form the core of the heat exchanger shown in FIG. 2.

As best seen in FIG. 4, each heat-exchanger plate 136 may include three inlet apertures 146 that each define a portion of a corresponding one of inlet manifolds 140. Each heat-exchanger plate 136 may also include four combination apertures 148 that each have an inlet portion 150 defining a portion of a corresponding one of outlet manifolds 142 and an overlap portion 152, the function of which is described below. The three relatively large regions of plate located between adjacent pairs of combination apertures and in thermally conductive communication with heat-transfer surface may be considered heat-transfer fins 154, since it is at these regions that the majority of heat is transferred between core 130 and the working fluid.

With continuing reference to FIG. 4, each spacer plate 138 may include four outlet apertures 156 that each define a portion of a corresponding one of outlet manifolds 142. Each spacer plate 138 may also include three combination apertures 158 that each have an inlet portion 160, a first overlap portion 162, a second overlap portion 164 and an interconnecting portion 166 extending between the inlet portion and first and second overlap portions. Inlet portion 160 defines a portion of a corresponding one of inlet manifolds 140 and first and second overlap portions 162, 164 each fluidly communicate with one or two corresponding overlap portions 152 of the heat-exchanger plates 136, depending upon the location of the particular spacer plate within core 130. That is, if spacer plate 138 forms an end of core 130, each of first and second overlap portions 162, 164 will fluidly communicate with only one corresponding overlap portion 152 in the sole adjacent heat-exchanger plate 136. Otherwise, each spacer plate 138 will be located directly between two heat exchanger plates 136, and, therefore, each of first and second overlap portions 162, 164 will fluidly communicate with corresponding overlap portions 152 of both heat-exchanger plates.

Figure 5:
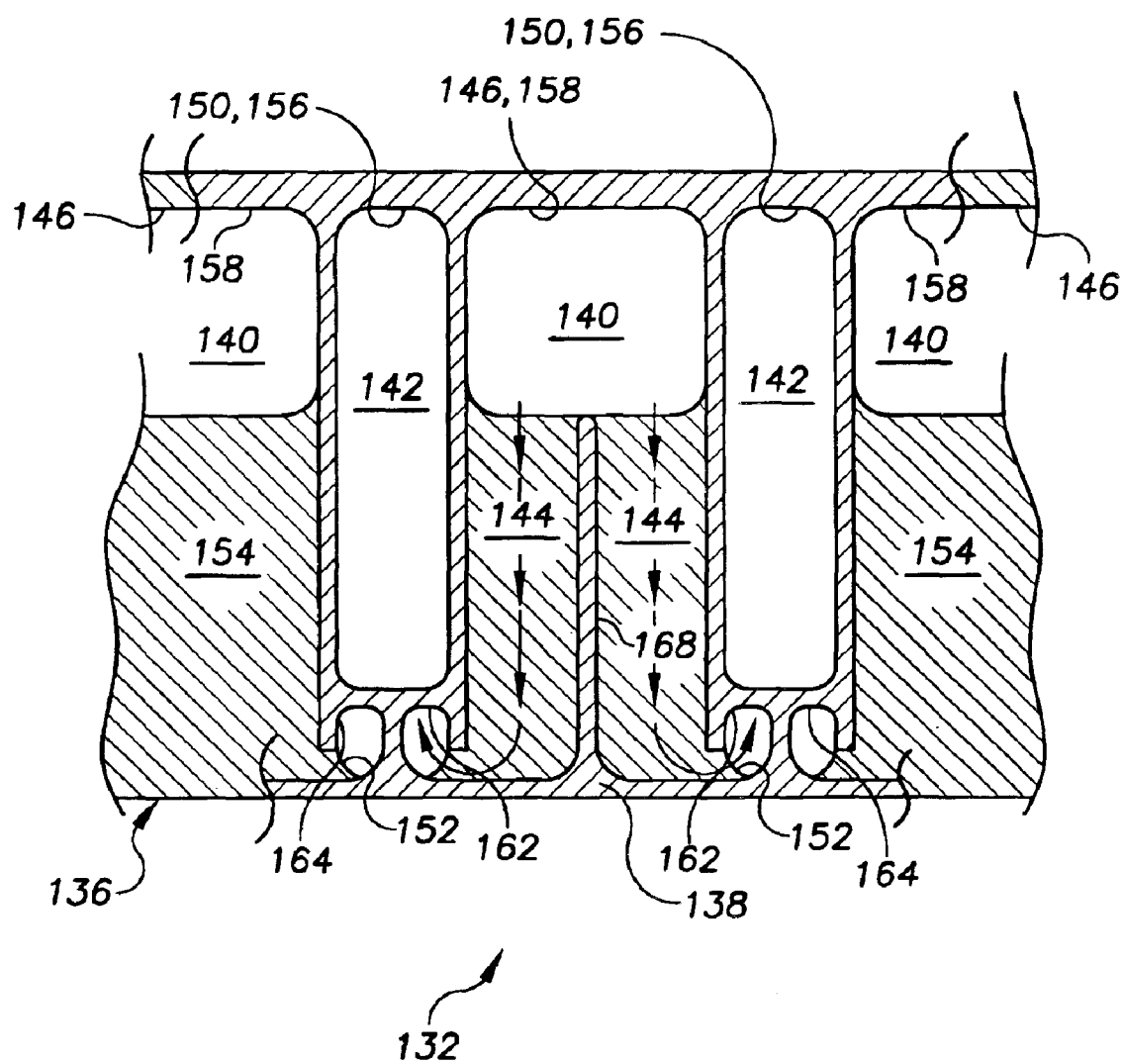
FIG. 5 is a partial elevational view of the heat-exchanger plate and spacer plate of FIG. 3 in proper registration with one another, showing the flow passageways defined thereby.

Interconnecting portion 166 of each combination aperture 158 generally defines a substantial portion of a corresponding one of interconnecting channels 144 that extends between one inlet manifold 140 and the two outlet manifolds 142 immediately adjacent that inlet manifold. The remaining portion of each interconnecting channel 144 is generally defined by first and second overlap portions 162, 164 of corresponding combination aperture 158 of spacer plate 138 and corresponding overlap portions 152 of combination apertures 148 of the one or two heat-exchanger plates 136 immediately adjacent that spacer plate. FIG. 5 shows one pair of spacer plate 138 and heat-exchanger plate 136 in proper registration with one another to illustrate how inlet manifold 140, outlet manifold 142 and interconnecting channel 144 are defined by the pair of plates and how overlap of combination apertures 148, 158 facilitate fluid communication between the inlet and outlet manifolds.

Each interconnecting channel 144 may optionally include one or more flow partitions 168, e.g., for dividing the flow from one inlet manifold 140 to two or more outlet manifolds 142 and/or maintaining laminar flow within core 130. Flow partitions 168 may also be used to control the amount of the working fluid flowing through an individual interconnecting channel 144. Accordingly, flow partitions 168 may be used to control the heat transfer capacity of each fin 154.

For example, in the embodiment shown, spacer plate 138 is shown as containing combination apertures 158 that are large relative to the overall area of the spacer plate. Thus, interconnecting channels 144 are relatively wide and are separated from outlet apertures by relatively narrow webs 170. In addition, optional flow partitions 168 are relatively narrow. These characteristics maximize the area of each fin 154 exposed to the working fluid and maximize the flow in corresponding interconnecting channel 144, thereby maximizing the heat transfer capacity at that fin, all other variables being equal. However, in alternative embodiments, the widths of partitions 168, and/or webs 170, may be increased to decrease the area of the corresponding fin 154 exposed directly to the working fluid and to decrease the flow in corresponding interconnecting channel 144, thereby decreasing the heat transfer capacity at that fin.

Accordingly, a designer of NFHX 120 of the present invention can vary the heat transfer efficiency of core 130 both along the length and width of heat-transfer surface 128 to be commensurate with the heat transfer needs of the various regions of device 122. For example, device 122 may require maximum cooling power along a central strip extending the length of heat-transfer surface but only minimal cooling power at adjacent edge strip regions. Accordingly, flow partitions 168 and/or webs 170 adjacent the interconnecting portions 166 of the center ones of combination apertures 158 in each spacer plate 138 along the length of core 130 would be relatively narrow, creating wide interconnecting channels 144 having relatively high heat transfer capacity along the center of the core. In contradistinction, flow partitions 168 and/or webs 170 adjacent the interconnecting portions 166 of combination apertures 158 outboard of the center combination apertures would be relatively wide, creating narrow interconnecting channels 144 having relatively low heat-transfer capacity adjacent the lateral margins of core 130.

In a preferred embodiment, outlet manifolds 142 are located alternatingly with inlet manifolds 140 across the width of core 130, as shown, and are provided in a number one greater than the number of the inlet manifolds. This arrangement allows each interconnecting channel 144 to fluidly communicate with one inlet manifold 140 at one end and the two immediately adjacent outlet manifolds 142 at the opposite end. An important aspect of this arrangement is that the flow areas of the inlet and outlet manifolds 140, 142 can be maximized to minimize the pressure drop along the inlet and outlet manifolds, allowing NFHX 120 to achieve a large heat flux transfer capacity. One skilled in the art will appreciate that, if desired, inlet manifolds 140 may be provided in a number one greater that outlet manifolds. In addition, inlet and outlet manifolds 140, 142 may be provided in any other configuration and in any number desired, including alternating arrangements wherein e.g., more than one outlet manifold 142 is located between immediately adjacent inlet manifolds. The composite volume consisting of the volume of inlet manifolds 140 and the volume of outlet manifolds 142 preferably makes up at least 20% of the total volume of core 130 NFHX 120. More preferably, the composite volume of inlet and outlet manifolds 140, 142 makes up 30% or more of the total volume of core 130. Although larger composite volumes of inlet and outlet manifolds 140, 142 may be desirable in terms of reducing the pressure drop within the inlet and outlet manifolds, one skilled in the art will appreciate that composite volumes smaller than 20% of the total volume of core 130 may be necessary to satisfy one or more other criteria, such as constraints on the overall size of NFHX 120 In addition, each interconnecting channel 144 may fluidly communicate with any number of inlet and outlet manifolds 140, 142 desired.

Referring particularly to FIGS. 2 and 3, inlet plenum 124 receives the working fluid from flow re-circulation system 125 and distributes it among inlet manifolds 140. Inlet plenum 124 includes an inlet cover plate 172, an inlet wall plate 174 and an inlet plenum plate 176 sandwiched therebetween. Inlet cover plate 172 contains an inlet port 178 for receiving the working fluid from flow re-circulation system 125. Inlet wall plate 174 is configured to provide the working fluid only to inlet manifolds 140, blocking the working fluid from entering outlet manifolds 142. Thus, inlet wall plate 174 contains three inlet apertures 180 in registration with inlet manifolds 140 of core 130. Inlet plenum plate 176 may include a single plenum aperture 182 that, when inlet plenum 124 is assembled, forms a plenum channel 184 that fluidly communicates with inlet port 178 and inlet apertures 180. Similar to heat-exchanger and spacer plates 136, 138 of core 130, one or more of plates 172, 174, 176 of inlet plenum 128 may be composite plates consisting of two or more like-shaped plates to provide the necessary overall plate thickness and/or required dimensions of the apertures formed within the plates.

Outlet plenum 126 collects the working fluid from outlet manifolds 142 and returns it to flow re-circulation system 125. Outlet plenum 126 includes an outlet wall plate 186, an outlet cover plate 188 and an outlet plenum plate 190 sandwiched therebetween. Outlet wall plate 186 blocks the working fluid from flowing out of inlet manifolds 140 and, thus, contains four outlet apertures 192 in registration with outlet manifolds 142 of core 130. Outlet cover plate 188 contains an outlet port 194 for returning the working fluid to flow re-circulation system 125. Outlet plenum plate 190 may include a single plenum aperture 196 that, when outlet plenum 126 is assembled, forms a plenum channel 198 that fluidly communicates with outlet apertures 192 and outlet port 194. Similar to plates 172, 174, 176 of inlet plenum 124 one or more of plates 186, 188, 190 may be composite plates consisting of two or more like-shaped plates to provide the necessary overall plate thickness and/or required dimensions of the apertures formed within the plates. The configurations of inlet and outlet plena 124, 126 shown providing NFHX 120 with working fluid inflow at one end and outflow at the opposite end is merely illustrative. One skilled in the art will appreciate that inlet and outlet plena 124, 126 may be reconfigured to provide, e.g., working fluid inflow and outflow at one or both ends of NFHX 120, along one or both sides of the NFHX that are perpendicular to the ends and heat transfer surface 128, or at one or both the upper and lower surfaces of the NFHX.

Heat-exchanger plates 136 are preferably made of a material having a high thermal conductivity, such as copper or aluminum. In some applications, it may be desirable to minimize the thermal strain mismatch between NFHX 120 and device 122 (see FIG. 2). For example, when device 122 is a silicon-based microprocessor and NFHX 120 is provided for cooling the microprocessor, a thermal strain mismatch between, e.g., a copper heat-exchanger plate and the microprocessor can cause mechanical failure in the microprocessor, which has a coefficient of thermal expansion much lower than copper. However, other materials are available that have good thermal conductivity and relatively low coefficients of thermal expansion and may be suitable for heat-exchanger plates 136. Examples of such materials include composites of copper-tungsten, copper molybdenum, and aluminum-silicon carbide. Use of these materials would allow direct bonding of NFHX 120 to a microprocessor or other silicon or similar material based device 122.

Spacer plates 138 are preferably made of the same material as heat-exchanger plates 136 to avoid any problems, e.g., mechanical failure, arising from a mismatch between coefficients of thermal expansion of different materials. However, spacer plates 138 may be made from a material different from the material of heat-exchanger plates 138. Similarly, plates 172, 174, 176 of inlet plenum 124 and plates 186, 188, 190 of outlet plenum 126 are preferably made of the same material as heat-exchanger plates 136, but may be made of a different material.

In a preferred embodiment, plates 136, 138, 172, 174, 176, 186, 188, 190 of NFHX may have thicknesses in the sub-millimeter regime. Accordingly, plates 136, 138, 172, 174, 176, 186, 188, 190 may be made from foil. However, some or all of the plates may have thicknesses greater than one millimeter and accordingly may be made from sheet or plate material. Apertures 146, 148, 156, 158, 180, 182, 192, 196 and ports 178, 194 may be formed in the foil using a material removal technique, such as chemical milling, laser ablation, micro-machining, conventional machining or heat cutting, among others. The choice of technique may largely depend upon the thickness and type of the material from which the plates are formed and the limitations of the individual techniques. Plates 136, 138, 172, 174, 176, 186, 188, 190 may be bonded to one another, e.g., by diffusion or adhesive bonding.

In an exemplary embodiment of NFHX 120 utilizing water as the working fluid and being capable of providing on the order of 250 watts/cm$^2$ of cooling power at a flow rate of approximately 20 cc/s, heat-transfer surface 128 may have a length of about 10 mm and a width of about 10 mm. Such an embodiment may be used, e.g., to cool a microprocessor. In this embodiment, all plates 136, 138, 172, 174, 176, 186, 188, 190 are preferably made of copper and the widths of interconnecting channels 144 are maximized by minimizing dimensions of flow partitions 168 and webs 170, as described above. Accordingly, the thickness of heat-exchanger plates 136 may be on the order of 0.15 mm and the thickness of spacer plates 138 may be on the order of 0.05 mm. Thus, the depth of interconnecting channels 144 along stacking axis 134 at regions defined by spacer plate 138 is on the order of 0.05 mm, and the pitch between heat-exchanger plates 136 is on the order of 0.20 mm.

During use, the working fluid flows through NFHX 120 shown in FIGS. 3–5 as follows. First, the working fluid flows through inlet port 178 and into inlet plenum channel 184, where it is distributed through inlet apertures 180 in inlet wall plate 174 to inlet manifolds 140. As the working fluid flows along each inlet manifold 140, portions of the working fluid flow into the various interconnecting channels 144 distributed along the length of core 130. As the working fluid flows through each interconnecting channel 144, it first flows into the space defined by interconnecting portion 166 of combination aperture 158 of spacer plate 138 between adjacent heat-exchanger plates 136, where it is split into two flow paths by flow partition 168. The working fluid then flows to a corresponding one of first and second overlap portions 162, 164 of combination aperture 158, where it then flows into a corresponding outlet manifold 142 via overlap portion 152 of combination aperture 148 of heat-exchanger plate 136. Once the working fluid enters one of outlet manifolds 142, it then flows through a corresponding one of outlet apertures 192 in outlet wall plate 186, into outlet plenum channel 198 and through outlet port 194. As one skilled in the art will recognize, the direction of flow through NFHX 120 may be reversed, whereupon the passageways and openings presently designated as "inlet" become outlet passageways and openings and the passageways and openings presently designated as "outlet" become inlet passageways and openings.

Figure 6:
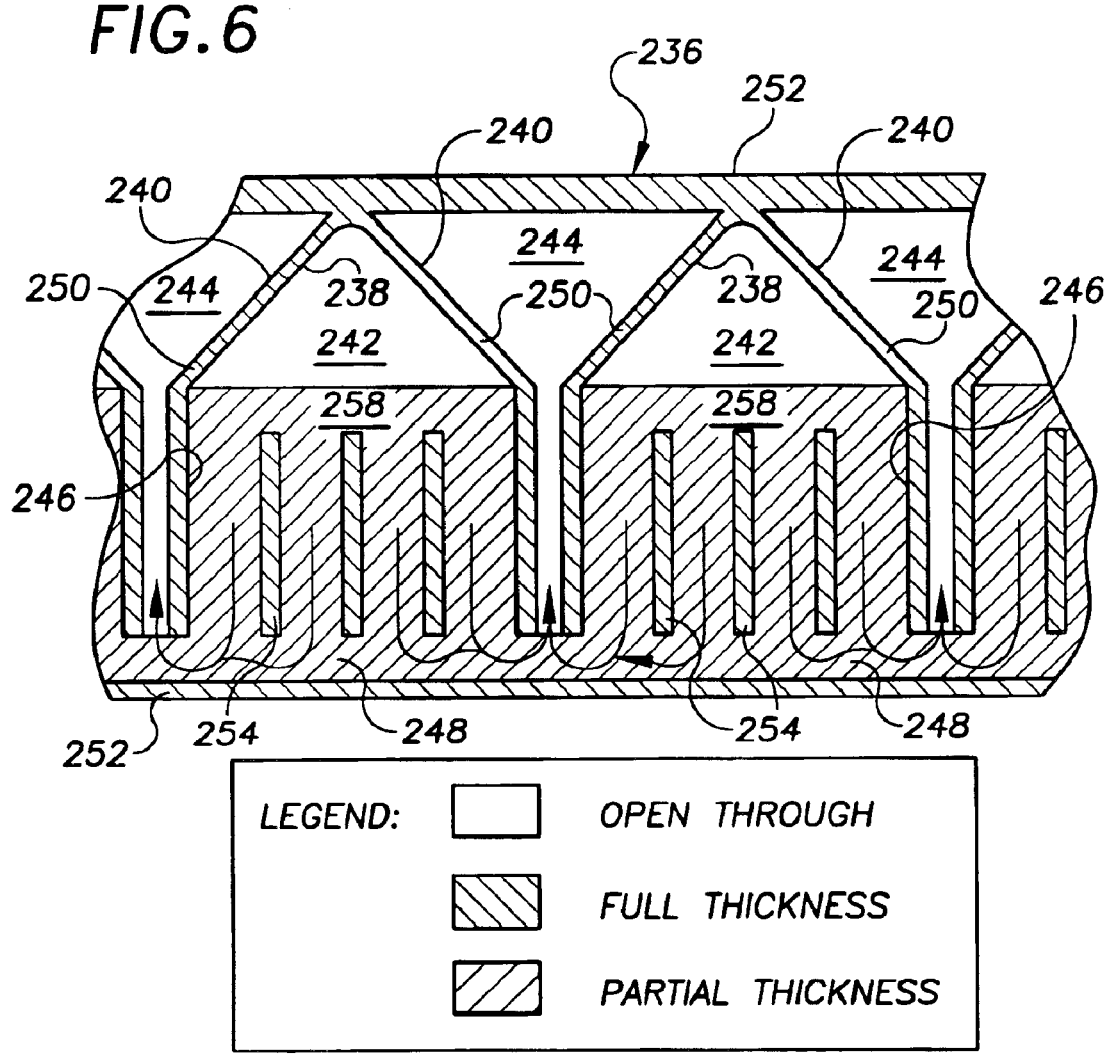
FIG. 6 is an elevational view of an alternative embodiment of a heat-exchanger plate that may be used to form the core of the normal-flow heat exchanger of FIG. 2.

FIG. 6 shows an alternative heat-exchanger plate 236 that may be used to form core 130 (FIG. 2) of NFHX 120. Heat-exchanger plate 236 is configured such that a separate spacer plate, such as spacer plate 138 of FIGS. 3–5, is not required between adjacent heat-exchanger plates. Similar to heat-exchanger plate 136, heat-exchanger plate 236 has inlet apertures 238 and outlet apertures 240 for respectively defining portions of inlet and outlet manifolds 242, 244 of core 130. However, instead of the interconnecting channels being substantially defined by apertures in a spacer plate, interconnecting channels 246 are defined by recessed regions 248 formed in heat-exchanger plate 236. Accordingly, webs 250, marginal regions 252 and partitions 254 of heat-exchanger plate 236 are each defined by the full thickness of the material from which the heat-exchanger plate is made and fins 258 are defined by a partial thickness of the material.

For example, in the exemplary embodiment of NFHX 120 for cooling a microprocessor described above with respect to FIGS. 3–5, heat exchanger plate 136 and spacer plate 138 were described as having thicknesses on the order of 0.15 mm and on the order of 0.05 mm, respectively, yielding a pitch between adjacent heat-exchanger plates on the order of 0.20 mm. To form core 130 of heat-exchanger plates 236 that has comparable dimensions, the full thickness of each plate would be on the order of 0.20 mm and the depth of recessed regions 248 would be on the order of 0.05 mm. Heat-exchanger plates 236 may be made of the same materials as described above with respect to heat-exchanger plates 136. In addition, similar aperture-forming techniques may be used to form inlet and outlet apertures 238, 240. Recessed regions 248 may be formed by coining or a material removal technique, such as chemical milling, laser ablation, micro-machining or conventional machining, among others. One skilled in the art will appreciate that the foregoing recess-forming techniques may be used on one or both sides of a plate so that a single plate may take the place of any two or more plates solely having apertures formed therein for defining a particular passageway within a stack of plates. For example, referring to FIG. 3, inlet wall plate 174, heat exchanger plate 136, and spacer plate 138 may be replaced by a single plate having recesses formed on one side corresponding to inlet apertures 180 and on the opposite side corresponding to outlet apertures 156 and combination apertures 158.

Another difference between heat-exchanger plate 236 of FIG. 6 and heat-exchanger plate 136 of FIGS. 3–5 is that heat-exchanger plate 236 includes a highly-efficient arrangement of generally triangular inlet and outlet apertures 238, 240 for defining like-shaped inlet and outlet manifolds 242, 244. Such an arrangement of inlet and outlet apertures 238, 240 locates the majority of flow area within the inlet and outlet manifolds distal from heat-transfer surface 128. This arrangement avoids placing significantly-sized apertures adjacent heat-transfer surface 128 that would reduce the efficiency of NFHX 120 by reducing the size of fins 258 and/or the cross-sectional area between the heat-transfer surface and the fins available for conducting heat therebetween.

Figure 7:
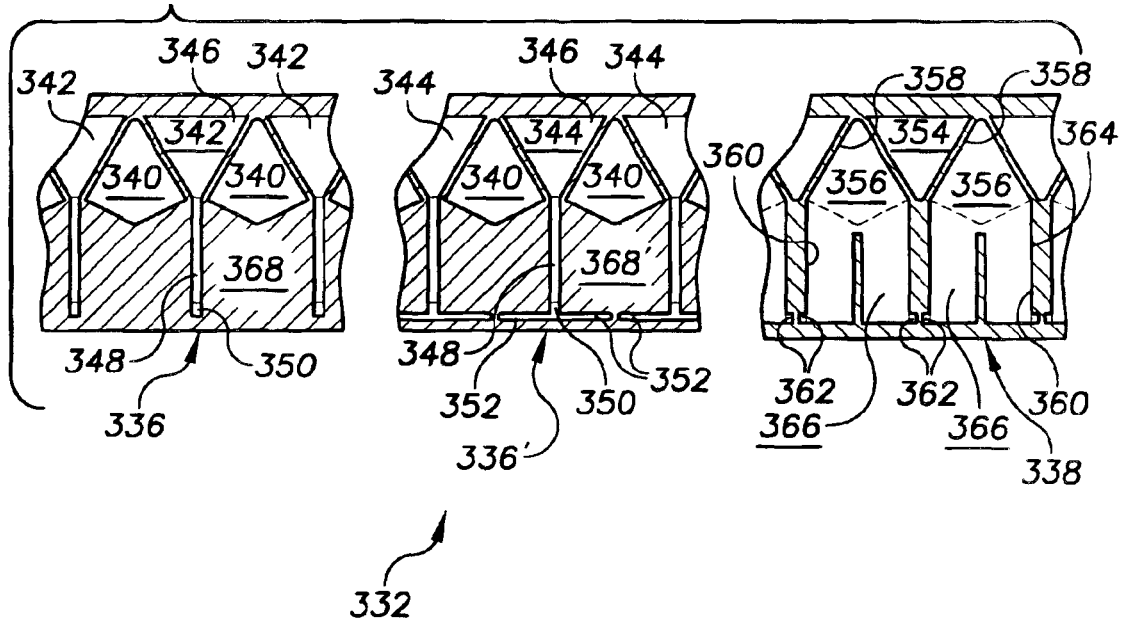
FIG. 7 is composed of partial elevational views of a pair of heat-exchanger plates and a partial elevational view of a corresponding spacer plate that may be used to form the core of the normal-flow heat exchange of FIG. 2.

FIG. 7 shows a plate triad 332 that may be used in place of plate pairs 132 of FIGS. 3–5 to form core 130 (FIG. 2) of NFHX 120. Plate triad 332 includes a spacer plate 338 similar to spacer plate 138 of FIGS. 3–5, but includes a first heat-exchanger plate 336 and a second heat-exchanger plate 336' in place of sole heat-exchanger plate 136 of FIGS. 3–5. First and second heat-exchanger plates 336, 336' each include a plurality of inlet apertures 340 and a plurality of combination apertures 342, 344 each defining an outlet portion 346, an interconnecting portion 348 and an overlap portion 350. Each combination aperture 344 of second heat-exchanger plate 336' further includes a plurality of plena portions 352, the function of which is described below. Spacer plate 338 includes a plurality of outlet apertures 354 and a plurality of combination apertures 356, each defining an inlet portion 358, an interconnecting portion 360 and a pair of overlap portions 362.

When properly stacked within plate triad 332, second heat-exchanger plate 336' is located between first heat-exchanger plate 336 and spacer plate 338. When a plurality of plate triads 332 are properly stacked with one another to form core 130, one spacer plate 338 is typically located immediately adjacent second heat-exchanger plate 336' and another spacer plate 338 is typically located adjacent first heat-exchanger plate 336 opposite second heat-exchanger plate 336'. Webs 364 of adjacent spacer plates 336, in combination with interconnecting portions 348 of first and second heat exchanger plates 336, 336', form a portion of interconnecting channel 366. Similarly, when a plurality of plate triads 332 are properly stacked with one another to form core 130 (FIG. 2), each spacer plate 338 is typically located immediately between a corresponding second heat-exchanger plate 336' and first heat-exchanger plate 336 of another plate triad 332. Thus, fins 368, 368' of these first and second heat-exchanger plates 336, 336', together with the interconnecting portions 360 of spacer plate 338 define portions of interconnecting channels 366. Accordingly, each interconnecting channel 366 within core 130 made from a plurality of plate triads 332 generally comprises interconnecting and overlap portions 360, 362 of spacer plate 338; interconnecting, overlap and plena portions 348, 350, 352 of second heat-exchanger plate 336'; and interconnecting 348 and, overlap portions 350 of first heat-exchanger plate 336. Plena portions 352 of second heat exchanger plates 336' are provided to increase the flow area between interconnecting portion 360 of spacer plate 338 and interconnecting portions 348 of first and second heat-exchanger plates 336, 336' to decrease the pressure drop within each interconnecting channel 366 and to increase the uniformity of flow across the width of interconnecting portion 360 of each interconnecting channel.

To illustrate an application of plate triad 332, in the exemplary embodiment for cooling a microprocessor described above with respect to FIGS. 3–5, heat exchange plate 136 and spacer plate 138 were described as having thicknesses on the order of 0.15 mm and on the order of 0.05 mm, respectively, yielding a pitch between adjacent heat-exchanger plates on the order of 0.20 mm. To form core 130 of plate triads 332 that has similar dimensions, the thickness of first heat-exchanger plate 336 may be 0.09 mm, the thickness of second heat exchanger plate 336' may be 0.06 mm and the thickness of spacer plate 338 may be 0.05 mm. These thicknesses are only illustrative and may be any desired. First and second heat-exchanger plates 336, 336' and spacer plates 338 may be made of the same materials as described above with respect to heat exchange plates 136 and spacer plates 138 of FIGS. 3–5. In addition, similar aperture-forming techniques may be used to form inlet and outlet apertures 340, 354 and combination apertures 342, 344, 356.

FIG. 8 shows a heat-exchanger plate 436, a plurality of which may be stacked with one another to form core 130 (FIG. 2). Heat exchanger plate 436 embodies both the single-plate embodiment described above with respect to FIG. 6 and the flow-plena embodiment described above with respect to FIG. 7. That is, by virtue of heat-exchanger plate including a recess 438 formed therein and having a first portion 440, and a second portion 442 for defining interconnecting channels 444 and flow plena 446, respectively, a second heat exchanger plate (336' FIG. 7) having flow plena formed therein and a separate spacer plate (138, FIGS. 3–5) defining a significant portion of interconnecting channels are not required. Heat-exchanger plate 436 may be made of the same materials and formed as described above with respect to heat-exchanger plate 236 of FIG. 6.

To illustrate an application of heat exchanger plate 436, in the exemplary embodiment for cooling a microprocessor described above with respect to FIG. 7, first and second heat exchange plates 336, 336' and spacer plate 338 were described as having thicknesses of 0.09 mm, 0.06 mm and 0.05 mm, respectively, yielding a pitch between adjacent heat-exchanger plates on the order of 0.20 mm. To form core 130 of heat-exchanger plates 436 that has similar dimensions, the full thickness of each heat-exchanger plate would be on the order of 0.20 mm, the depth of first portion 440 of recess would be on the order of 0.05 mm, and the depth of second portion 442 of the recess would be 0.11 mm.

While the present invention has been described in connection with preferred embodiments, it will be understood that it is not so limited. On the contrary, it is intended to cover all alternatives, modifications and equivalents as may be included within the spirit and scope of the invention as defined in the claims appended hereto.

What is claimed is:

1. A heat exchanger for transferring heat to or from a fluid, comprising:
   a) a heat transfer surface adapted to transfer heat to or from said heat exchanger;
   b) a manifold region substantially coextensive with, and spaced from, said heat transfer surface;
   c) a heat transfer region substantially coextensive with said heat transfer surface and located between said manifold region and said heat transfer surface;
   d) a plurality of internal walls defining a plurality of alternating inlet and outlet passages in said manifold region, said internal walls extending into said heat transfer region in a direction substantially normal to said heat transfer surface to a location proximate said heat transfer surface so as to divide said heat transfer region into a plurality of alternating inflow and outflow portions; and
   e) a heat transfer structure located in each of said plurality of inflow portions, said heat transfer structure in good thermal communication with said heat transfer surface and containing a plurality of channels each having a primary flow axis substantially normal to said heat transfer surface;

wherein:
   i) said plurality of inflow portions are in fluid communication with corresponding ones of said plurality of inlet passages;
   ii) said plurality of outflow portions are in fluid communication with corresponding ones of said plurality of outlet passages; and
   iii) adjacent ones of said plurality of inflow portions and said plurality of outflow portions are in fluid communication with each other through a space between corresponding ones of said plurality of internal walls and said heat transfer surface.

2. A heat exchanger according to claim 1, wherein said heat transfer surface has a heat transfer capacity that varies over said heat transfer surface, and said plurality of inflow portions of said heat transfer region include flow restrictions, wherein at least some of said flow restrictions are different from others of said flow restrictions so as to vary said heat transfer capacity over said heat transfer surface.

3. A heat exchanger for transferring heat to or from a fluid, comprising:
   a plurality of plates stacked together, wherein each of said plurality of plates includes:
   a) a heat transfer edge;
   b) a manifold area extending the length of, and spaced from, said heat transfer edge;
   c) a heat transfer area extending the length of said heat transfer edge and located between said manifold area and said heat transfer edge; and
   d) a plurality of webs defining a plurality of alternating inlet and outlet apertures in said manifold area, said webs extending into said heat transfer area in a direction substantially perpendicular to said heat transfer edge to a location proximate said heat transfer edge so as to divide said heat transfer area into a plurality of alternating heat transfer fins and outflow apertures, wherein the thickness of the plate area corresponding to said fins is less than the full thickness of the plate;

wherein, when said plurality of plates are stacked together:
   i) said heat transfer edges define a heat transfer surface adapted to transfer heat to or from said heat exchanger,
   ii) said manifold areas form a manifold region substantially coextensive with, and spaced from, said heat transfer surface;
   iii) said heat transfer areas form a heat transfer region substantially coextensive with said heat transfer surface and located between said manifold region and said heat transfer surface;
   iv) said plurality of webs define a plurality of internal walls which define a plurality of alternating inlet and outlet passages in said manifold region, said internal walls extending into said heat transfer region in a direction substantially normal to said heat transfer surface so as to divide said heat transfer region into a plurality of alternating inflow and outflow portions;
   v) said heat transfer fins forming heat transfer structures in each of said plurality of inflow portions, said heat transfer structures in good thermal communication with said heat transfer surface and containing a plurality of channels each having a primary flow axis substantially normal to said heat transfer surface;
   vi) said plurality of inflow portions are in fluid communication with the corresponding ones of said plurality of inlet passages;
   vii) said plurality of outflow portions are in fluid communication with the corresponding ones of said plurality of outlet passages; and
   viii) adjacent ones of said plurality of inflow portions and said plurality of outflow portions are in fluid communication with each other through a space between corresponding ones of said plurality of internal walls and said heat transfer surface.

4. A heat exchanger according to claim 3, wherein each of said plurality of plates is a composite plate comprising two or more thinner plates, each of said thinner plates having a plurality of apertures, wherein when said thinner plates are stacked in proper registration with each other to form said composite plates, said inlet apertures in at least one of said thinner plates extend over the areas corresponding to said heat transfer fins in at least another one of said thinner plates, so as to form said heat transfer fins in said composite plates.

5. A heat exchanger according to claim 3, wherein said heat transfer surface has a heat transfer capacity that varies over said heat transfer surface, and said plurality of inflow portions of said heat transfer region include flow restrictions, wherein at least some of said flow restrictions are different from others of said flow restrictions, so as to vary said heat transfer capacity.

* * * * *